United States Patent [19]

Tanaka

[11] 3,980,958
[45] Sept. 14, 1976

[54] SIGNAL SEEKING TUNING SYSTEM WITH ILLEGAL CHANNEL DETECTION MEANS

[75] Inventor: Akio Tanaka, Evanston, Ill.

[73] Assignee: Zenith Radio Corporation, Chicago, Ill.

[22] Filed: July 29, 1974

[21] Appl. No.: 492,365

[52] U.S. Cl................................. 325/470; 325/459
[51] Int. Cl.².......................................... H04B 1/32
[58] Field of Search............ 325/334, 459, 418–423, 325/469, 470; 334/15; 331/1 A

[56] References Cited
UNITED STATES PATENTS

| | | | |
|---|---|---|---|
| 3,555,446 | 1/1971 | Bramer | 331/1 A |
| 3,818,353 | 6/1974 | Sakamoto | 325/422 |

Primary Examiner—Robert L. Griffin
Assistant Examiner—Jin F. Ng
Attorney, Agent, or Firm—Joseph T. Downey; Nicholas A. Camasto

[57] ABSTRACT

A signal recognizing television tuning system employing a varactor tuner controlled by a ramp voltage source. A counter sequentially supplies channel number information for changing the ramp voltage until the tuner is tuned to receive only signals falling within a restricted frequency range corresponding to the selected channel number. Signal recognition means stop further advance of the counter upon recognition of a television signal. If no television signal is recognized, the counter is advanced and generates a next sequential channel number. An illegal channel number detector causes the counter to automatically advance to the next channel number whenever a non FCC allocated channel number appears.

11 Claims, 4 Drawing Figures

SIGNAL SEEKING TUNING SYSTEM WITH ILLEGAL CHANNEL DETECTION MEANS

CROSS REFERENCE TO RELATED PATENT APPLICATIONS

This application is related to the following patent and applications all of which are assigned to the assignee of the present application and all of which are hereby incorporated by reference. U.S. Pat. No. 3,851,254, entitled "Digital Systems and Method for Determining and Displaying a Television Channel Number", in the means of Richard G. Merrell and Akio Tanaka, Ser. No. 430,446, filed Jan. 3, 1974, entitled "Channel Seeking Tuning System", in the name of Akio Tanaka (hereafter referred to simply as the Tanaka application), U.S. Pat. No. 3,931,579 entitled "Digital Signal Seeking Tuning System", in the names of John Ma and Akio Tanaka, U.S. Pat. No. 3,946,319 entitled "All Electronic Digital Tuner System with Memory" in the names of John Ma and Akio Tanaka and Ser. No. 484,475, filed July 1, 1974, entitled "Band Decoder for All Channel Digital Tuning System" in the name of Akio Tanaka.

BACKGROUND OF THE INVENTION

1. Field of the Invention

The present invention relates generally to television tuning systems and more particularly to such systems which operate to "seek" broadcast television signals having corresponding FCC allocated channel numbers.

2. Description of the Prior Art

A problem which is indigenous to all-channel television tuning systems is that the FCC television channel frequencies are allocated in four disconnected frequency bands, whereas the corresponding channel identification numbers (exclusively used by viewers for identification) run serially, without regard to the frequency band interruptions. In any given locale the allocated television channels may be widely dispersed throughout the VHF and UHF frequency bands, thus burdening the viewer with becoming familiar with an irregular sequence of non-related channel numbers for ordinary viewing.

Many signal seeking tuning systems have been proposed in the past, primarily to avoid the channel number problem and the inconvenience of tuning through non-operating channels or channel positions. No such system has, however, been successfully commercialized. In many of the proposed systems a ramp voltage generator, under control of a signal detector, supplies a voltage controlled oscillator for scanning of the appropriate frequencies. The received signal is usually filtered and a frequency discriminator is employed to produce a control potential (error signal) whose magnitude and polarity are the analog of the detected difference between the proper IF frequency and the actual frequency translated by the IF portion of the receiver. The error signal is used to correct the voltage of the ramp to adjust the tuner in the proper direction to "lock" to the signal. A threshold circuit may be used to skip over signals that are too weak for satisfactory viewing. These systems are confronted with the conflicting requirements of a "capture" range broad enough to pick up signals during sweeping and narrow enough to lock to proper signals only. This imposes significant limits on the sweeping speed.

In addition, in a signal seeking system the combined effects of capture range, lock range and the heterodyne process make is possible for an unwanted signal to "beat" with the local oscillator signal to produce a signal in the IF amplifier of proper frequency. These spurious or unwanted signals may be in the form of noise, image frequencies, or adjacent channel carriers. Many elaborate detection arrangements have been proposed to cope with the spurious signals in signal seeking tuning systems. Most require responses to more than one signal characteristic and there are some in the patent literature which detect as many as four distinct signal characteristics in an effort to preclude recognition of an erroneous signal.

The above problems were solved by the invention in copending related application Ser. No. 430,446 and U.S. Pat. No. 3,946,319. In the latter, a digital tuning system includes a counter which automatically sequences through channel numbers to provide tuning information for a varactor tuner to sweep through the broadcast television spectrum. It operates by bringing the tuner to a restricted frequency range about the picture carrier of the selected channel before enabling signal recognition apparatus to determine if a television signal is present. If not, the counter generates the next sequential channel number and the process is repeated.

The signal seeking system of the latter application also disposes illegal channel number detection means for automatically stepping the counter past non-allocated FCC channel numbers. The combination of elements producing a television signal seeking system for sequentially tuning to distinct ranges of frequencies corresponding only to FCC allocated channel numbers comprises the instant inventive system. Not only does this inactive system cover the spectrum more quickly, but more importantly, it materially aids the system noise immunity by precluding tuning to frequency ranges where there can be no proper television signals.

OBJECTS OF THE INVENTION

An object of this invention is to provide a novel all channel signal seeking tuning system; and It is another object of this invention to provide an all channel signal seeking tuning system which exhibits a high degree of noise, i.e., spurious signal immunity.

SUMMARY OF THE INVENTION

In accordance with this invention a television tuning system includes a voltage controlled tunable element operable in the FCC allocated television frequency bands which contain a plurality of discrete fixed frequency bandwidth television signals identifiable by corresponding allocated channel numbers. Channel selecting means sequentially select channel information to control voltage generating means which apply suitable voltages for tuning the tunable element to receive corresponding television signals. Recognition means determine the presence of television signals and terminate the operation of the selecting means when a television signal is detected. Illegal channel information detection means prevent terminating the operation of the channel selecting means when the selected channel information does not correspond to any of the FCC designated television signals.

BRIEF DESCRIPTION OF THE DRAWINGS

The features of the present invention which are believed to be novel are set forth with particularity in the appended claims. The invention, together with further objects and advantages thereof, may best be understood by reference to the following description taken in conjunction with the accompanying drawings, in the several figures of which like reference numerals identify like elements, and in which:

DESCRIPTION OF THE PREFERRED EMBODIMENT

Figure 1:
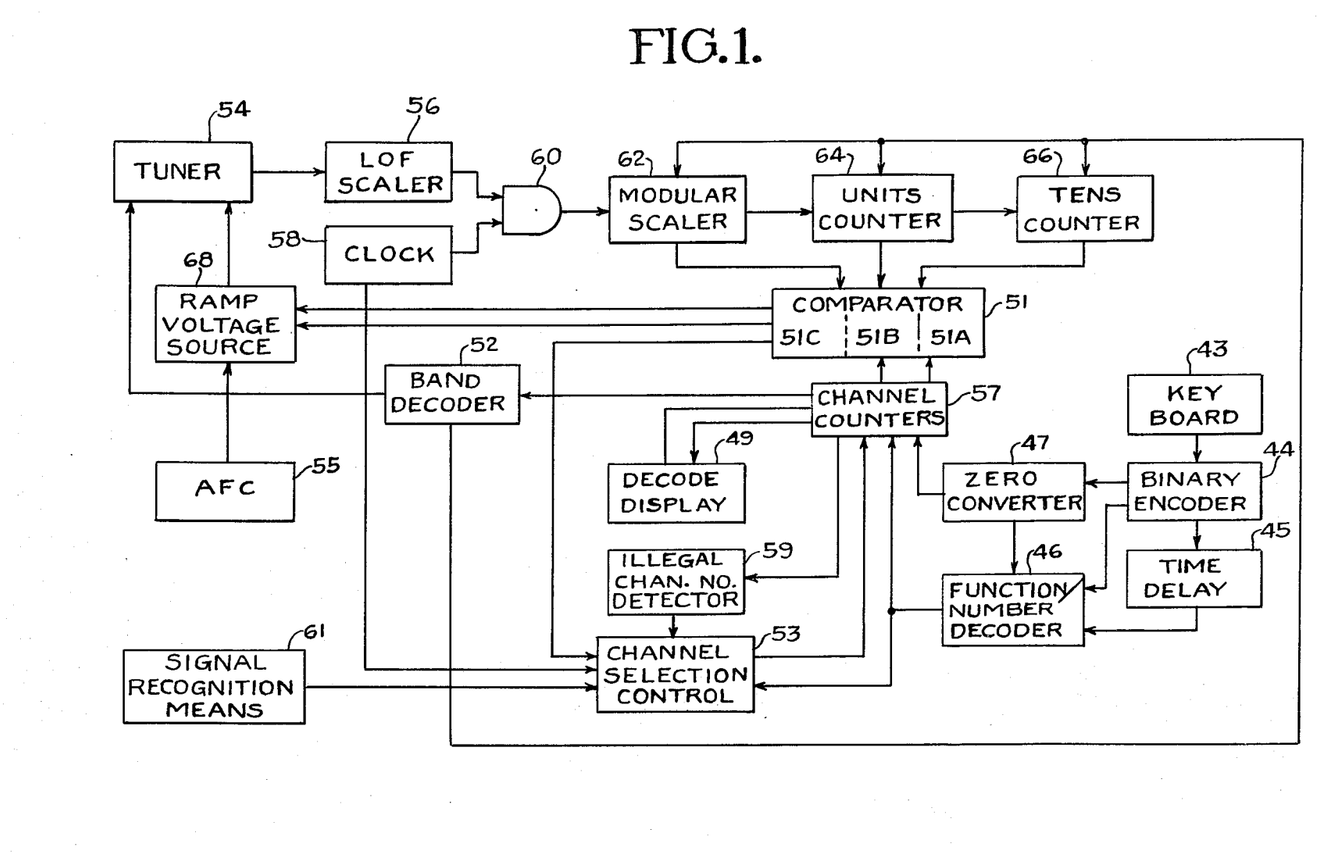
FIG. 1 depicts, in block diagram form, a tuning system employing the invention.

FIG. 1 is a block diagram depicting a tuning system constructed in accordance with the invention. A keyboard 43 includes means for entering either specific channel number information for tuning to a specific channel or Up and Down tuning commands to begin searching for a television signal. The keyboard information is encoded into a special binary representation in encoder 44, supplied to a zero converter 47 and, both directly and through a time delay system 45, to a function/number decoder 46. The purpose of time delay system 45 is to prevent operation with spurious signals which might be generated by keyboard contact bounce. A channel counter 57 has inputs coupled to zero converter 47, function/number decoder 46 and a channel selection control 53. The directly supplied information to function/number decoder 46 assists in the operation of channel selection control 53. As will be explained later in detail, zero converter 47 functions to alter the special binary representation used in binary encoder 44 to the standard binary representation employed in the remainder of the system. The output of zero converter 47 supplies channel number information in standard binary form to channel counter 57 and to channel selection control 53.

The keyboard input may be either a channel number digit or an Up or Down tuning command. This feature allows direct access to the tuning system by a specific channel number input rather than seeking an adjacent broadcast signal. The word "command" is used throughout to indicate an Up or Down signal input. The function/number decoder firstly determines which of an Up or Down command has been given and secondly distinguishes between commands and channel numbers. If an Up or Down command is entered at the keyboard, the channel selection control is initiated causing the signal seeking process to begin in the selected direction. Connected to the output of channel counter 57 is a decode display 49 which provides a visual indication of the selected channel number.

An illegal channel number detector 59 is coupled to an output of channel counter 57 and to an input of channel selection control 53. Channel selection control 53 has inputs coupled to a clock pulse generator 58 and to a signal recognition means 61.

Another output of channel counter 57 is connected to a band decoder 52 which determines, from the encoded channel information in channel counter 57, (1) in which of the several discontinuous frequency bands the selected channel is; (2) which of UHF or VHF circuitry in the tuner is activated; and (3) the preset information supplied to the channel computing means for decoding of the oscillator frequency. Thus, an output of band decoder 52 is connected to a varactor tuner 54 and another output is connected in common to a modular scaler 62, a units counter 64 and a tens counter 66. A conventionally derived automatic frequency control voltage source (AFC) 55 is coupled to a ramp voltage source 68 for maintaining the oscillator frequency tuned to the received signal picture carrier frequency.

The output of a local oscillator frequency (LOF) scaler 56 and the output of clock pulse generator 58 are coupled to the inputs of a logic gate 60. The signal on the output of gate 60 constitutes the tuning information and comprises a train of oscillator frequency-related pulses in fixed time intervals. The oscillator frequency is determined by counting the number of pulses in an interval. The output of logic gate 60 is connected to modular scaler 62 which, in turn, is connected to units counter 64 which, in turn, is connected to tens counter 66. On a time sample basis, the tuning information is supplied to the appropriately preset modular scaler and units and tens counters which determines the channel number corresponding to the television frequency to which the tuner is tuned. The circuitry from the LOF scaler to the comparator constitutes the channel computing means.

The outputs of modular scaler 62 and counters 64 and 66 are connected to a comparator 51 which has a modular section 51C, a units section 51B and a tens section 51A. Sections 51B and 51A are also supplied the desired or selected channel number from channel counter 57. The derived (computed) channel number is compared with the desired channel number and signals dependent upon the condition of comparator 51 are coupled to ramp voltage source 68 for controlling both the tuning voltage direction and rate of change. The output voltage from ramp voltage source 68 drives tuner 54 to make corrective changes in its local oscillator frequency, until comparator 51 indicates equality between the derived channel number and desired channel number and, as will be described, that the tuned signal is within a range of frequencies preselected by the window.

After a predetermined delay, information from comparator 51 is analyzed for coincidence with a signal from recognition means 61 in channel selection control 53. If there is no coincidence, a signal is sent to channel counter 57 to cause sequencing to the next designated channel number during a $\overline{\phi}_1$ compare interval. If there is coincidence (indicating tuning to a broadcast signal of that channel number), channel counter 57 is not sequenced and searching is terminated.

DEFINITIONS

For simplicity, only logic connections are shown in the figures and only voltage sources and grounds necessary to establish the logic control signal levels are shown. Positive logic is used throughout and logic gates are simply referred to by their function names, i.e., AND, NAND, OR and NOR, without the word "gate". A 1 represents a high logic (or signal voltage) level and a 0 corresponds to a low logic level. Thus, an AND gate has its output at 1 only if all inputs are at 1; a NAND gate has its output at 0 only if all inputs are at 1; an OR gate has its output at 1 if any input is at 1; and a NOR gate has its output at 0 if any input is at 1. Inverters function to interchange the 1 and 0 levels.

All binary representations are conventionally arranged in descending powers of 2 from left to right. Leads labelled D, B, C and A and D' and C' interchangeably represent binary digits or bits as well as lead identification. Similarly leads may be identified by the functional signals they carry.

The terms "input" and "output" generally indicate the device terminal unless signal is specified. An open circle on an input terminal designates a negative edge triggered device. $\phi$ represents a timing pulse signal and $\bar{\phi}$ its inverse or complement. If $\phi$ is 0, $\bar{\phi}$ is 1 and vice-versa. The term "inhibit" indicates the condition in which a gate output is no longer dependent upon signals applied to its remaining inputs. The term "enable" designates the condition in which a gate output is dependent upon the signals applied to the remaining inputs. As far as practical, the various portion of the tuning system will be described in detail on a functional basis. Complete detailed descriptions of the channel computing means ramp generator (two speed) band decoder and clock are in the Tanaka application, which is incorporated by reference herein. For simplicity, however, these details will not be repeated here.

Figure 2:
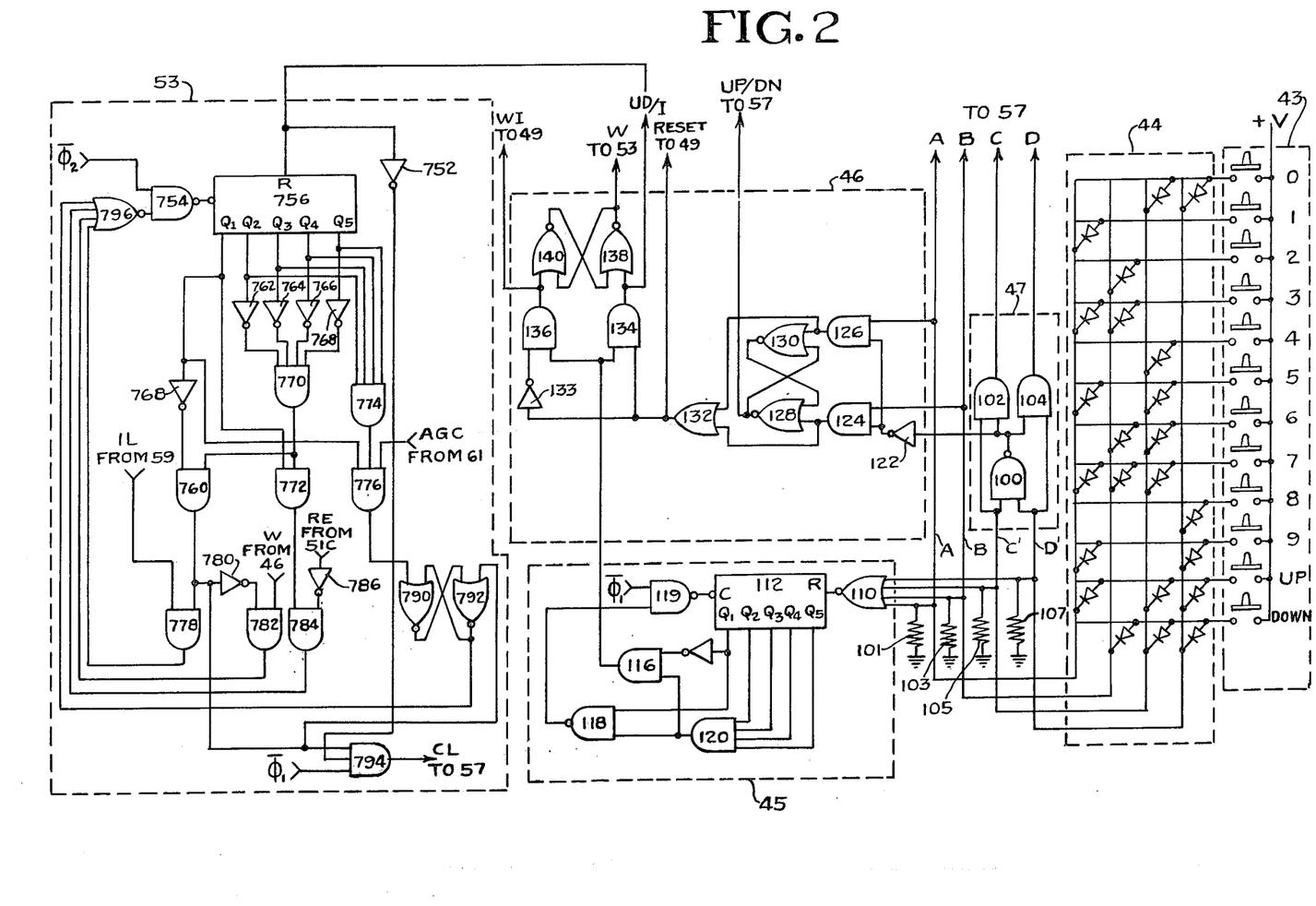
FIG. 2 shows the circuitry of blocks 43, 44, 45, 46 and 53 of FIG. 1 which comprise the keyboard input arrangement, the function-number decoder and the channel selection control system.

KEYBOARD 43 AND BINARY ENCODER 44 (FIG. 2)

FIG. 2 shows the channel number selection circuitry and includes binary encoder 44 comprising a diode matrix for encoding digits entered at keyboard 43. A source of positive voltage +V is applied to a parallel arrangement of switches, bearing appropriate identification in the form of digits 0–9 and Up and Down commands. The switches shown are single pole, single throw momentary contact type, but may be of any other suitable type. Each switch is selectively coupled by the diode matrix to an arrangement of four resistors 101, 103, 105 and 107 which are returned to ground. Switch operation establishes voltages on the resistors which correspond to the binary bit representation of the identifying digit or command associated with the selected switch. Voltages established on resistors 101, 103, 105 and 107 correspond respectively to the A, B, C' and D' special binary bit representations.

Assume channel 29 is desired. The switch corresponding to the digit 2 is momentarily depressed and connects +V, through the appropriate diode in the matrix, to resistor 103. Resistor 103 is connected to lead B, which now has +V thereon (ignoring the small voltage drop across the diode), the remaining leads A, C' and D' being at ground potential. Thus the digit 2 is encoded, the configuration of binary bits being 0010 for D', C', B and A, respectively, where 1 represents +V and 0 represents ground.

The switch designated by the digit 9 is now momentarily depressed, which places +V, through the diode matrix, on resistor 107 and resistor 101. These resistors are connected, respectively, to the D' and A leads. Thus the binary representation for the digit 9 is 1001. In similar fashion, keyboard 43 and diode matrix 44 function to encode the remaining digits and commands. The Up command is encoded as binary 1101 for D'C'BA and the Down command as binary 1110.

ZERO CONVERTER 47 (FIG. 2)

The special keyboard binary representation does not conform to the standard binary representation upon which the comparator and other system components operate. Since it is desirable for the keyboard to have a rest position with no signal level being established, the standard binary configuration corresponding to the digit zero is chosen. Hence at rest, zero voltage levels are established on leads D'C'BA. For digit zero the standard binary representation for the decimal number 12 is used, namely 1100.

Zero converter 47 re-encodes the D'C'BA representation into standard DCBA form. C' and D' connect to the inputs of a NAND 100. C' and the output of NAND 100 connect to the inputs of an AND 102 and the output of NAND 100 connects to an input of an AND 104, with D' connecting to its other input. The output of AND 102 appears on lead C and the output of AND 104 appears on lead D, both corresponding to their counterparts C and D in the standard binary representation DCBA.

As mentioned above, the digit 9 keyboard binary representation on leads D', C', B and A is 1001. C' is at 0 and D' is at 1 and hence the inputs of NAND 100 are at 0 and 1. The output of NAND 100 is thus at 1 and the corresponding inputs of AND 102 and AND 104 are at 1. The two inputs of AND 102 are now at 0 and 1 and its output is at 0, while the inputs of AND 104 are both at 1 and its input is at 1. Leads C and D are respectively at 0 and at 1. Thus the leads D, C, B and A are respectively 1001 and the zero converter has had no effect.

However, a zero input digit has the keyboard binary representation 1100. C' and D' are both at 1. The inputs of NAND 100 are both at 1 and its output is at 0. One input each of AND 102 and AND 104 is at 0 and their outputs are at 0. The corresponding standard C and D binary bits are zero. Since the A and B binary bits are not affected by the zero converter, they are still at 0 and the keyboard special representation of zero (1100) is converted to the standard binary representation of 0000.

TIME DELAY 45 (FIG. 2)

As mentioned, a time delay is provided to delay interpretation of the keyboard binary signal to preclude response to false signals due to contact bounce. Time delay 45 employs a five stage counter 112 which delays the enabling of subsequent logic gates for 30 increments of 1 level pulses of the clock output timing signal $\bar{\phi}_1$. $\bar{\phi}_1$ is selected for convenience but any other suitable pulse recurring each clock cycle may be employed for this purpose. Leads A, B, C' and D' are connected to the input of a NOR 110 whose output is connected to the reset terminal (R) of time delay counter 112. The Q1 output of counter 112 connects to one input of a NAND 118 and, after coupling through an inverter 114, connects to an input of an AND 116. The Q2–Q5 outputs of counter 112 connect to the four inputs of an AND 120. The output of AND 120 is coupled to the second input of each of AND 116 and NAND 118. The output of NAND 118 and clock signal $\bar{\phi}_1$ connect to the inputs of a NAND 119 whose output is connected to the clock terminal (C) of counter 112. The circle on the input terminal of counter 112 indicates that it is a negative edge triggered device, a convention employed throughout the description. The output of AND 116 connects to one input each of an AND 134 and and AND 136 for enabling these gates after the desired time delay.

A keyboard input which does not correspond to the rest position of 0000 causes NOR 110 to go to a 0 level output signal which resets counter 112. The Q5–Q1 outputs of counter 112 indicate its count status in standard binary form and upon reset, are all at 0. For this condition and during 29 subsequent $\bar{\phi}_1$ at 1 time pulses, the output of AND 116 is at 0, inhibiting gates 134 and 136. During the period, the output of AND 120 is at 0 and NAND 118 has a 1 level signal output which is applied with each 1 level $\bar{\phi}_1$ clock pulse on the inputs of NAND 119. For each occurrence of $\bar{\phi}_1$ at 1, the resulting 0 level output signal from NAND 119 is coupled to the clock input terminal of counter 112 and advances the counter one binary count.

The enabling of subsequent logic gates is delayed until counter 112 reaches a predetermined status. When counter 112 achieves the binary number, 11110 (Q5–Q1 respectively), which is a decimal count of 30, the normally 0 signal level output of AND 120 becomes a 1 signal level since outputs of Q2–Q5 are now all at 1. The 0 signal level at the Q1 output is coupled through inverter 114, resulting in the second input of AND 116 being at 1 and in AND 116 producing a 1 level output signal for enabling AND's 134 and 136. These gates remain enabled for one complete clock period, i.e., from the 30th to the 31st $\bar{\phi}_1$ at 1 pulse, which also determine the length of the "initiate" pulses in subsequent circuitry. Note that binary number 11110 in counter 112 is the only possible enabling count for gates 134 and 136 since no other count in the permissible range between 00000 and 11111 will result in both inputs of AND 116 being at 1. When the counter reaches 11111 the enabling pulse is terminated and the counter remains at this status awaiting another reset condition. Thus, the desired time delay is achieved.

FUNCTION/NUMBER DECODER 46 (FIG. 2)

Function/number decoder 46 firstly distinguishes Up from Down commands and secondly channel number digit inputs from commands. An inverter 122, an AND 124, an AND 126, a NOR 128 and a NOR 130 form circuitry for distinguishing an Up from a Down command. NOR 128 and NOR 130 form a direct coupled RS flip/flop. The flip/flop remains in either of its two stable states, as indicated by the output signal level of NOR 128, until the signals at its inputs are changed to correspond to the other state. Its input signal levels are determined by two of the four possible combinations of 0 and 1 signal levels at the outputs of AND 124 and AND 126. When both inputs are at the same signal level (i.e., 0—0) no change in state occurs. The output of NOR 128 is at 1 for an Up command and a 0 for a Down command. For timing considerations an Up or Down command determination is made prior to differentiating between commands and digits.

The output of NAND 100 in zero converter 47 is connected through inverter 122 to one input each of AND 124 and AND 126. Lead A is connected to the second input of AND 126 and Lead B is connected to the second input of AND 124. The output of AND 124 connects to one input of an OR 132 and one input of NOR 128. The output of AND 126 is connected to the second input of OR 132 and to one input of NOR 130. The outputs of NOR 128 and 130 are cross-connected to their second inputs. An UP/DN signal is taken from the output of NOR 128 and supplied to units counter 175 and tens counter 177 for determining their direction of advancement. The counters do not count or sequence at this time however. The output signal of OR 132 provides a reset pulse signal labelled RESET, which will be explained later.

Assume an Up command input (keyboard representation 1101). C' and D' are at 1 and the output of NAND 100 is at 0. The 0 signal level, through inverter 122, results in the corresponding inputs of AND 124 and AND 126 being at 1. Since B is at 0 and A is at 1, the second input of AND 124 is at 0 and the second inputs of AND 126 is at 1, making the outputs of AND 124 and AND 126 at 0 and 1, respectively. With these signals supplied to the flip/flop, the output of NOR 128 is at 1, indicating an Up command.

Similarly, with a Down command (keyboard representation 1110) the output of NOR 128 attains a 0 signal level. The Down and Up keyboard representations differ in that the A and B signal levels are interchanged with A at 0 and B at 1. Consequently, the second input of AND 126 is at 0, and the second input of AND 124 is at 1, resulting in the outputs of AND 124 and AND 126 being at 1 and 0, respectively. With these signals supplied to the flip/flop, the output of NOR 128 is at 0, indicating a Down command.

Since, for all other allowable input signals from the keyboard, at least one input each of AND 126 and AND 124 is at 0, these signals have no effect on the state of the flip/flop, which is solely determined by Up and Down commands.

As mentioned, an Up command results in the outputs of AND 124 and AND 126 being at 0 and 1, respectively, causing the output of OR 132 (RESET) to assume a 1 level. A Down command results in the output of AND 124 and AND 126 being at 1 and 0, respectfully, and the output of OR 132, is also at a 1. However, it may be shown that for any other keyboard input the output of OR 132 and the corresponding RESET signal is at 0. Thus, the units and tens flip/flop 162 of FIG. 3, which receives the RESET pulse signal, is reset when an Up or a Down command is entered at the keyboard. The only other binary input which could produce a 1 level RESET signal is 1111, which input is not possible with the keyboard circuit arrangement.

Function/number decoder 46 further distinguishes commands from digits. The output of OR 132 is connected to a second input of AND 134 and through an inverter 133 to the second input of AND 136. It will be recalled, that the first inputs of AND 134 and AND 136 receive the time-delayed enabling signals from the output of AND 116. The output of AND 134, labelled U/DI is an Up or Down initiate pulse. It has a 1 level for the period between the 30th and 31st $\bar{\phi}_1$ at 1 pulses when a command has been received. At all other times U/DI is at 0. U/DI at 1 causes a five stage mode counter 756 in channel selection control 53 to be reset and, operating through an inverter 752, inhibits an AND 794 during its duration. The output of AND 134 is also connected to one input of a NOR 138. The output of AND 136, labeled WI for "write initiate", is a 1 level pulse during the period between the 30th and 31st $\bar{\phi}_1$ at 1 pulses when a digit has been entered at the keyboard and all other times, WI is at 0.

The output of AND 136 is also supplied to one input of a NOR 140, which together with a NOR 138, form a second direct coupled RS flip/flop. Nor 140 assumes and maintains a 1 signal level output for commands and a 0 signal level output for digits. One input of NOR 138 is connected to the output of AND 134 and the outputs of NOR 138 and NOR 140 are cross-connected to form second inputs. The state of the flip/flop is indicated by the signal level on the output of NOR 138, labelled W, and when W is at a 1 level inhibits NAND 782 which is part of the logic for the channel selection control.

For a digit input, the output of OR 132 is at 0 and in conjunction with a signal level of 1 on the output of AND 116 in time delay circuit 45, results in the outputs of AND 134 and AND 136 being at 0 and 1, respectively. Under these input conditions to the flip/flop, the output of NOR 138 (W) is at 1. Thus W is at 1 for a digit input and w is at 0 for a command input.

A command input results in the output of OR 132 being at 1 which causes the outputs of AND 134 and AND 136 to be at 1 and o, respectively, and the output of 138 to be at 0. As described for the first RS flip/flop, 0 on the outputs of AND 134 and AND 136 (which occurs for the keyboard rest condition input of 0000) has no effect upon the state of the flip/flop. Thus the output of NOR 138 (U/D signal) is at 0 for Up or Down commands and a 1 for digit inputs.

CHANNEL SELECTION CONTROL 53 (FIG. 2)

FIG. 2 also shows the circuitry for channel selection control 53 which when initiated causes channel counter 57 to sequence to the next adjacent channel number. It comprises a five stage binary mode counter 756 whose states are divided into three groups defining operational modes. Channel selection control 53, its mode counter 756 and channel counter 57 comprise channel selection means. The first mode consists only of the zero state of the mode counter; the second mode is only the 1 state; and the third mode comprises advancement through the remaining states until the mode counter reaches its last state.

When an Up (or Down) command is given mode counter 756 is reset to its zero state, which is its first mode. A single pulse is sent to channel counter 57 to sequence the number in the direction designated by the command entered at the keyboard. This new channel number is analyzed to determine if it corresponds to an FCC allocated channel number. If it does not, mode counter 756 remains in mode 1 (0 state) and additional pulses are sent to channel counter 57 until an allocated (legal) channel number is generated. When a legal channel number has been generated mode counter 756 is advanced to mode 2 by operation of a NAND 754. Counter 756 remains in its second mode or 1 state until a ramp equality signal is received from comparator 51, which occurs only when the receiver is tuned to receive signals falling within a restricted frequency range or window about the picture carrier frequency of the selected channel.

Upon occurrence of this ramp equality condition the mode counter is advanced to mode 3. In this mode the counter continues to count under control of clock 58 to provide a delay. At a suitable selected count the output of signal recognition means 61 is analyzed to determine if a television signal has been recognized within the frequency window. It may then be said that signal recognition means 61 is rendered effective. If a television signal is recognized, a state retention device inhibits further advancement of the mode counter and, as a result, no change is permitted for channel counter 57. This corresponds to normal viewing of the receiver with a conventional AFC acting to maintain the receiver locked to the signal in the window. If no signal is recognized the mode counter is advanced to mode 1 (zero state) and the procedure is repeated for another channel number.

The U/DI signal from AND 134 is supplied to the reset terminal (R) of mode counter 756 and through an inverter 752 to one input of an AND 794. A $\bar{\phi}_2$ timing signal is supplied to one input of NAND 754 whose output is coupled to the clock terminal (C) of mode counter 756, causing it to advance one state or count whenever the output of NAND 754 goes to a 0 level. Mode counter 756 has 32 states designated as 00000 through 11111. The outputs of the mode counter, corresponding to standard binary representation, are labelled Q1 through Q5, with Q5 representing the most significant bit. The Q1 output terminal is connected to one input of an AND 772, one input of an AND 776 and, through an inverter 758, to one input of an AND 760. AND 760 operates as a "zero" state (mode 1) recognition gate and AND 772 operates as a "one" state (mode 2) recognition gate, as will be more fully explained later.

Outputs Q2 through Q5 are coupled respectively, through a group of inverters 762, 764, 766 and 768 to the inputs of an AND 770 and also directly to the inputs of an AND 774. The output of AND 770 is connected to a second input of AND 772 and a second input of AND 760. The output of AND 774 is connected to the second input of AND 776. The output of AND 760 is coupled to one input of an AND 778, a second input of AND 794, one input of a NOR 792 and, through an inverter 780, to an input of AND 782. The signal labelled IL, which is supplied by the output of a NAND 189 in illegal channel number detector 59, is coupled to the second input of AND 778. The output of AND 778 connects to an input of a four input NOR 796.

NOR 796 has four inputs, which may inhibit its output. Its output may be inhibited by (1)illegal channel number, (2) entry of a digit at the keyboard, (3) a ramp equality indication and (4)recognition of a television signal. Whenever NOR 796 is inhibited, mode counter 756 is prevented from advancing.

The W signal from NAND 138, is supplied to the second input of AND 782, the output of which connects to a second input of NOR 796. The output of AND 772 is connected to one input of an AND 784, whose other input is supplied, through an inverter 786, with a signal, labelled RE, from AND 728 in modular comparator 51C. The output of AND 784 is connected to a third input of NOR 796. The output of NOR 796 is connected to a second input of NAND 754. The output of signal recognition means 61, labelled AGC, is connected to a third input of AND 776 whose output connects to one input of a NOR 790.

NOR 790 and NOR 792 are cross-connected to form an RS type flip/flop with the output of NOR 790 being connected to an input of NOR 792 and the output of NOR 792 being connected to an input of NOR 790 and also to the fourth input of NOR 796. Timing signal $\bar{\phi}_1$ ($\phi_1$ at 1 defines the compare interval for comparator 51) is supplied to the third input of AND 794 whose output supplies a signal labelled CL to channel counter 57. When CL is at 1, channel counter 57 is sequences to its next count in a direction determined by the UP/DN signal.

When an UP or Down command is entered at the keyboard the U/DI pulse resets mode counter 756 to mode 1 (Q1 through Q5 at 0). The U/DI pulse, through inverter 752, also inhibits AND 794 and prevents (for its duration) any CL pulses from being sent to channel counter 57, which is conditioned to count in either an UP or Down direction by the UP/DN signal from NOR 128. At the next $\phi_1$ at 1 timing interval, a CL pulse is produced which advances channel counter 57 to the next channel numbr. This is the beginning of the channel search process and the ramp is driven to tune the receiver to the window about the picture carrier frequency corresponding to the new channel number. One input of AND 760 is at 1 due to Q1 being at 0. Confirmation that mode counter 756 is in its zero state is provided by ANd 760. Q2–Q5 are coupled through inverters to AND 770 whose output is at 1 only for the zero and one states in mode counter 756. Since the output of AND 770 is coupled to an input of ANd 760, the output of AND 760 is at 1 only for the zero state. Thus, upon recognition of the zero state and termination of the U/DI pulse, AND 794 is enabled to provide a positive CL signal at the next $\bar{\phi}_1$ at 1 timing interval. The 1 level signal output of AND 760 operates NOR 792 which sets the state of the NOR 790–NOR 792 flip/flop to zero as indicated by the output signal level at NOR 792. It should be noted that positive CL pulses can only be generated when the U/DI pulse is terminated, mode counter 756 is in mode 1 and $\bar{\phi}_1$ is at 1.

The output signal of AND 760 and the IL signal, which is at a 1 level for unallocated channel numbers, are coupled to the inputs of AND 778. If the new channel number in channel counter 57 is illegal, AND 778 will have a 1 level output which inhibits NOR 796 from having a 1 level output which, in turn, inhibits NAND 754 from having the 0 level output required to enable advance of mode counter 756 at the next $\bar{\phi}_2$ at 1 pulse. Mode counter 756 remains in mode 1 and clock pulses are sent to channel counter 57 to generate new channel numbers. Channel counter 57 sequentially produces channel numbers, one at a time, until the IL signal is at 0, indicating a number corresponding to an FCC allocated channel. For a legal channel, AND 778 has a 0 level output, NOR 796 a 1 level output and NAND 754 is enabled to operate when $\bar{\phi}_2$ is at 1 to advance mode counter 756.

In the second state of mode counter 756 (Q5 to Q1: 00001), which is produced by the generation of a legal channel number in channel counter 57, the output of AND 770 is at 1 and, in conjunction with Q1 at 1, causes AND 772 to have a 1 level output. Thus, AND 772 recognizes counter mode 2 by enabling ANd 784 to respond to an equality signal (RE at 1) from modular comparator 51C. During advancement of the ramp, RE is at 0 and both inputs to AND 784 are at 1 causing its output to be at 1, which inhibits NOR 796. A ramp equality the RE at 1 signal, through inverter 786, causes the output of AND 784 to be at 0 and, through NOR 796 and NAND 754, enables mode counter 756 to advance to mode 3.

In mode 3, mode counter 756 sequentially advances through its remaining states under control of the $\phi_2$ timing signal from clock 58 until it reaches its final state of 11111. At this state all inputs of AND 774 are at 1, its output is at 1 and thus one input of AND 776 is at 1. Q1 at 1 insures that the second input of AND 776 is at 1. This renders signal recognition means 61 effective. The third input of AND 776 is supplied from signal recognition means 61 and if it is at 1 during this 11111 state of mode counter 756, the output of AND 776 is at 1. This output drives the RS flip/flop whose output (NOR 792) assumes a 1 level and stops advance of mode counter 756 by inhibiting NOR 706. If the third input of AND 776 is not at 1 (indicating no television AGC signal of the appropriate level), the RS flip/flop does not change status and mode counter 796 is advanced to the next state (00000 or mode 1) and the process is repeated.

SIGNAL RECOGNITION MEANS 61

Signal recognition means 61 may employ any of a number of well-known AGC circuits, preferably the regular AGC circuit of the television receiver. The AGC circuit responds to vary the receiver gain in accordance with signal carrier strength and may have a minimum threshold level detector to preclude response to signals that are too weak to provide satisfactory viewing. In the circuitry of signal recognition means 61 (not shown) occurrence of a satisfactory level AGC signal provides a voltage level which will be recognized at a 1 level logic voltage by the tuning system. As described signal recognition means 61 is active at all times but is only interrogated for coincidence with a ramp equal signal at AND 776 during the 11111 state of mode counter 756.

It will be appreciated that practice of the invention is totally independent of the type of signal recognition means employed. It has been found that a simple AGC circuit response is sufficient to identify a television signal because the system will only respond to signals falling within the narrow window about the picture carrier frequency corresponding to the selected channel number. Restricting the window to 1 MHz, for example, as illustrated in the Tanaka application, obviates adjacent channel signals, wrong carrier recognition, etc. This window may be skewed relative to a selected principal signal as is described for modular comparator 51C.

Figure 3:
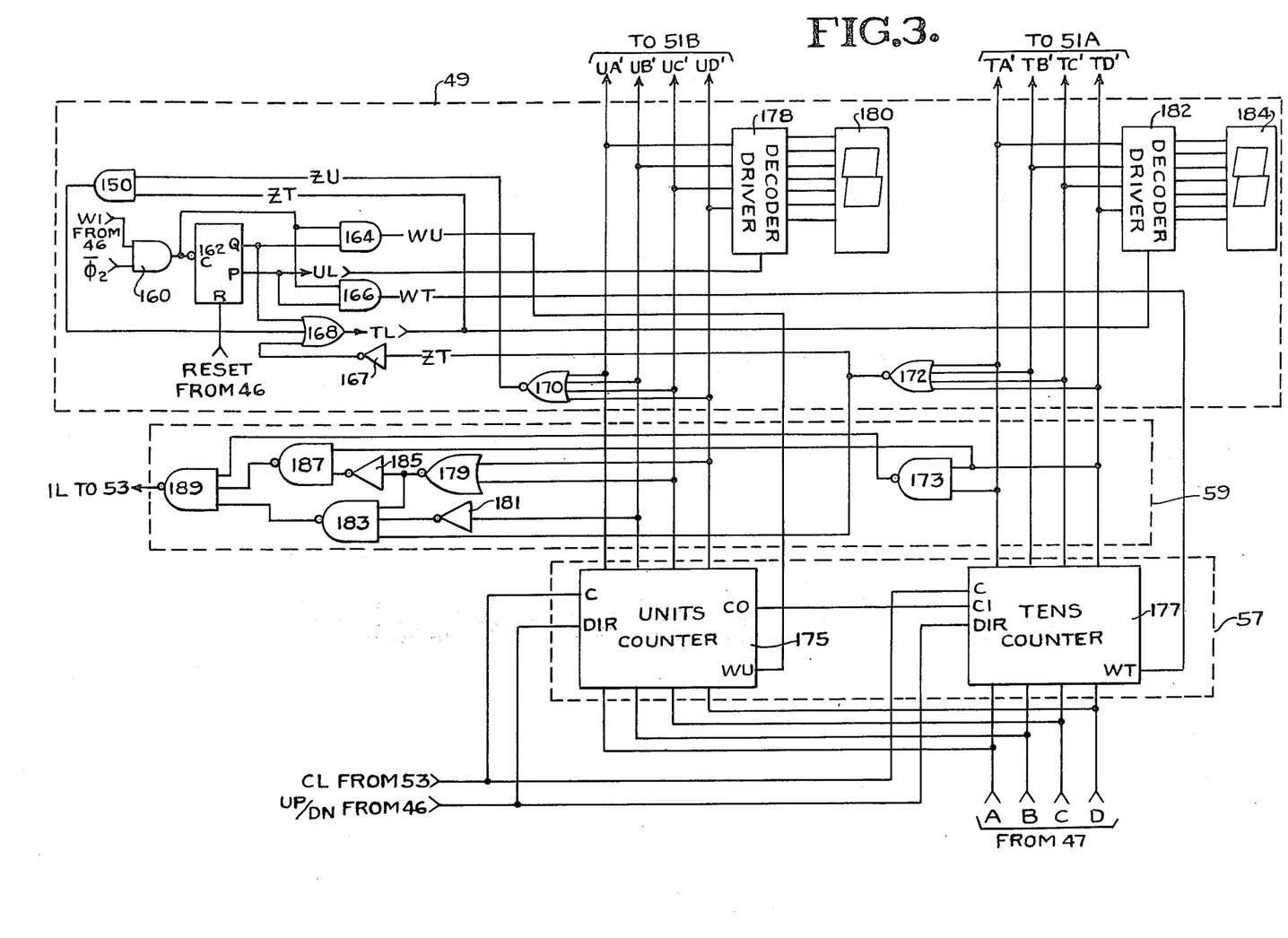
FIG. 3 shows the units and tens counters of block 57, the illegal channel number detector of block 59 and the decoding and display circuitry in block 49.

DECODE DISPLAY SYSTEM 49 (FIG. 3)

Decode display 49 comprises circuitry for identifying units and tens digits from keyboard 43, based on their order of entry, and for activation of the appropriate write-enable signals which permit information to be directly accessed to the corresponding units and tens counters which make up channel counter 57. The circuitry also controls blanking and illuminating of the channel number display.

The WI pulse signal generated at the output of AND 136 (FIG. 2) is applied along with the $\phi_2$ timing signal from the clock pulse generator to the inputs of an AND 160. The output of AND 160 is connected to a clock terminal (c) of a flip/flop 162 and to one input each of an input of an AND 164 and of an AND 166. The Q output of flip/flop 162 connects to the second input of AND 164 and to one input of an OR 168. The P output of flip/flop 162 supplies a units display control signal, labelled UL, which is coupled to a decoder divider 178 and to the second input of AND 166. The output of AND 164, labeled WU, connects to units counter 175 and the output of and 166, labelled WT, connects to tens counter 177. The WU and WT signals correspond to the write-enable commands for the units and tens counters, respectively. These signals assume a 1 level when permitting writing directly into the counters from the keyboard and a 0 level when preventing writing into the counters.

The output of a NOR 170, labelled ZU, is connected to one input of an AND 150. The output of a NOR 172, labelled ZT, is connected to the second input of AND 150 and, through an inverter 167, to the second input of OR 168. The output of AND 150 is also connected to the third input of OR 168. The output of OR 168, labelled TL, connects to a decoder driver 182 to provide control of the tens display 184. A UL and TL signal level of 1 enables display of the respective units and tens digits while a 0 signal level causes blanking.

Channel counter 57 consists of a units counter 175 and a tens counter 177. Units counter 175 has output leads UA', UB', UC' and UD' connected to NOR 170 for supplying the ZU signal and tens counter 177 has output leads TA', TB', TC' and TD' connected to NOR 172 for supplying the ZT signal. The ZU and ZT leads indicate the presence of 0000 in the counters. Thus, when the selected channel number includes a 0 units or tens digit, the corresponding ZU or ZT lead is at a 1 level.

Decoder driver 178 is also connected to the output leads of units counter 175 and drives a display device 180 for visually displaying the units digit. Similarly, the output leads of tens counter 177 are coupled to a decoder driver 182 which, through its display device 184, permits visual display of the tens digit. Any appropriate combination of decoder driver and display device may be used. Suitable units are manufactured by the Sperry Corporation under the model numbers DD700 and SP 752, respectively.

Flip/flop 162 is a two state device which distinguishes tens from units digits based on their order of entry at the keyboard. Whenever a number is entered, it will be recalled that a 1 level WI pulse signal is generated. This, together with a 1 level $\phi_2$ pulse (during the compare interval) at the input of AND 160 provides a 1 level output pulse to flip/flop 162. The trailing edge of this latter pulse changes the state of the flip/flop. Flip/flop 162 may also receive a RESET signal from the output of OR 132 in FIG. 2 which will cause it to assume a particular stat so that the next digit received will be treated as a tens digit. The state of the flip/flop is determined by the signal levels at its Q output and P output. For the first state, the Q outputs is 0 and correspondingly the P output is at 1, while the second state has the reverse relationship. It will be recalled from the discussion of FIG. 2 that the RESET signal is produced only by entry of an Up or Down command at keyboard 43. When such a command is given, flip/flop 162 has its P output at a 1 level and is in its first state ready for entry of a tens digit.

The channel number displays operate in a predetermined sequence in response to entry of successive digits. The tens display is blanked for all complete channel numbers less than 10 and the units display is blanked whenever a tens digit is entered. This arrangement serves as a valuable tuning aid for the viewer. Blanking of the tens display avoids a non-standard tens-position 0 for channel numbers less than 10. Thus, while channel 2 is entered at the keyboard as 02, it is displayed as 2.

The units display is directly controlled by the UL signal from the P output of flip/flop 162. When P is at 1 (first state of flip/flop 162) the units digit is displayed. Upon entry of a first (tens) digit, the WI signal (through AND 160) drives flip/flop 162 to its second state; P is now at 0 and the units display is blanked. Upon entry of a second (units) digit, flip/flop 162 resumes its first state (P at 1) and enables display of the units digit. The tens digit is blanked when all inputs of OR 168 are at 0. This condition is met when flip/flop 162 is in its second state (Q at 0), ZT is at 1 and either ZU or ZT is at 0.

Leads A, B, C and D are directly connected to units counter 175 and to tens counter 176. If the keyboard input is a command, no WI pulse signal is produced, and neither the units or the tens counters receive a write-enable (WU or WT) signal to permit direct access. In signal seeking mode the display could function during the entire process but the channel computer system operates so rapidly that the only number discernible from the display will be the channel number of the signal which is finally tuned in.

THE ILLEGAL CHANNEL NUMBER DETECTOR 59 (FIG. 3)

The illegal channel number detector monitors the status of tens counter 177 and units counter 175 to detect occurrence of any of the numbers: 00, 01, and 84–99, which numbers have not been allocated by the FCC.

Output lead TD' is connected to one input of a NAND 163 and one inputs of a NAND 187. TA' connects to the second input of NAND 173 whose output is connected to one input of a NAND 189. The output leads UD' and UC' are connected to the inputs of a NOR 179 whose output is coupled to one input of a NAND 183 and, through an inverter 185, to a second input of NAND 187. The output lead UB' is coupled through an inverter 181 to the second input of NAND 183. The output of NOR 172 which is the signal labelled ZT is connected to the third input of NAND 183. The output of NAND 187 is connected to the second input of NAND 189 and the output of NAND 183 is connected to the third input of NAND 189. The output of NAND 189 is the illegal channel control signal IL which is at 1 whenever the units and tens counters have generated one of the unallocated FCC channel numbers listed above.

The operation of the illegal channel number detector is as follows. The tens counter will represent a decimal 9 when leads TA', TD' are at 1. Under this condition NAND 173 has a 0 level output on an input of NAND 189 thus producing a 1 level IL signal for channel numbers 90 through 99.

For the 00 and 01 channel numbers, tens counter 177 will have all outputs at a 0 level causing signal ZT (output of NOR 172) to be at 1. For channel numbers with units digits between zero and three, UC' and UD' are both at 0 which establishes the output of NOR 170 at a 1 level. The UB' lead is at a 0 level for channel numbers 00, 01, 04, 05, 08 and 09 and at a 1 level for all other channel numbers. Thus the output of NAND 183 will be at 0 only for channel numbers 00 and 01, and through NAND 189, producing a 1 level illegal channel number control signal IL.

Tens counter 177 has a 1 level established on TD' for a tens digit of either 8 or 9. UC' is at a 1 level only for numbers 4 to 7 in units counter 175 and UD' will be at a 1 level only for digits 8 and 9 in units counter 175. Either UC' or UD' is at 1 for units digits of 4 through 9. Thus, NOR 179 is at 0 for channel numbers 4 through 9. The output of NOR 179, coupled through inverter 185, places a 1 level signal on an input of NAND 187, which together with the 1 level signal on its other input for numbers 80 and 90, places its output at 0 for channels in the two sequences 84 to 89 and 94 to 99. (The latter is ignored because of a separate determination of channels with a tens digit of 9.) The output of NAND 187 is also coupled to NAND 189 and a 1 level IL signal is produced for channel numbers in the range of 84 to 89. Thus, a 1 level IL signal is developed whenever the counter generates any of the listed unallocated FCC channel numbers.

CHANNEL COUNTER 57 (FIG. 3)

Units counter 175 and tens counter 177 are four stage binary types appropriately interconnected to provide parallel clocking so that they represent two digit channel numbers. The UP/Dn signal from NOR 128 is connected to an input terminal labelled DIR on each counter for determining direction of sequencing. The CL signal from AND 794 is coupled to the C input terminal of each counter and provides the pulses for advancing the counters to the next channel number.

The signal levels on leads ABCD are applied to both counters 175 and 176 but are not effective until a write-enable (WU or WT) signal is received. A 1 level at the WU input of units counter 175 and at the WT input of tens counter 177, permits entering (writing) channel number information into the respective counters directly from the keyboard. An output (CO) of units counter 175, is connected to an input (CI) of tens counter 177. This interconnection enables digit carryover when the separate units and tens counters are counting in the selected direction. The UA', UB', UC' and UD' outputs of units counter 175 correspond to the binary representation of the units digit. Similarly, the outputs of tens counter 177 labelled TA', TB', TC' and TD' correspond to the binary representation of the number in the tens counter. The outputs of both counters are supplied to appropriate inputs of comparator 51.

In the actual embodiment of the tuning system incorporating the invention, two RCA type CD4029A counters are employed. RAC publication SSD-203A "COS/MOS Digital Integrated Circuits" in the 1973 edition on page 146 shows a diagram of the parallel clocking arrangement of such counters. The DIR and C terminals in this application correspond respectively to the UP/D and CL terminals in the publication. It is obvious that many other standard components may be selected and appropriately arranged to provide the same counting function and accessibility, and the counters themselves, as distinct from the means incorporating them into the invention, are not part of the present invention.

Figure 4:
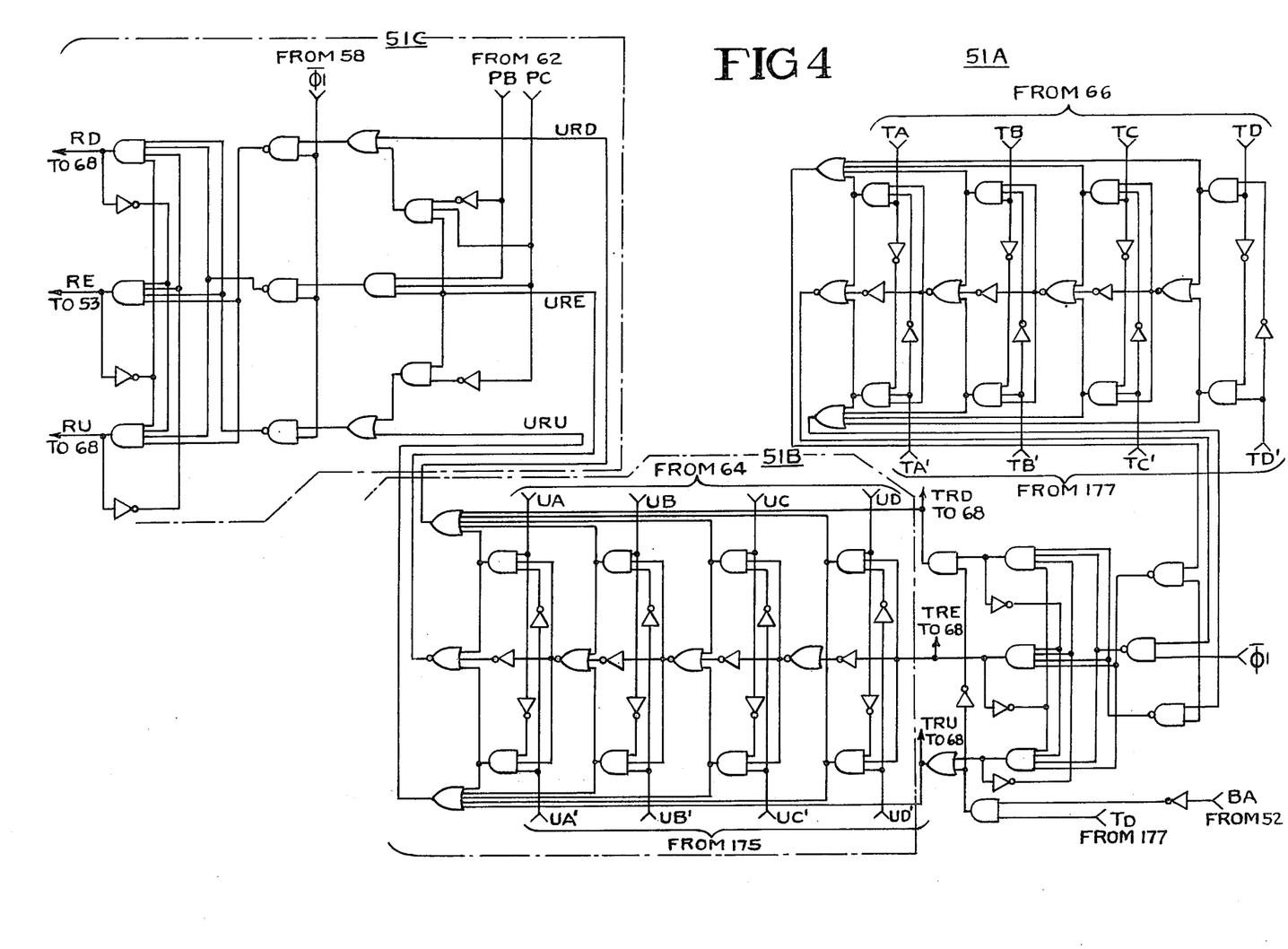
FIG. 4 shows comparator 51.

COMPARATOR 51 (FIG. 4)

FIG. 4 shows the tens and units comparator circuitry which compare the binary representation of the tens and units digits of the derived channel number from the channel number computer with the binary representation of the tens and units digits from channel counter 57 and the modular comparator which determines when the interchannel fraction is with the window established by the two preselected modular comparator residues. Appropriate signals indicative of the state of comparator are sent to ramp voltage source 68 for controlling tuner 54.

Both units comparator 51B and tens comparator 51A are of the sequential bit types having four bit-comparison stages, with each stage comprising two AND gates whose outputs are coupled to a NOR gate. In addition each stage has an appropriate output coupled to corresponding OR gates whose outputs indicate whether the larger bit string occurs in the derived channel digit from the channel computer or in the selected digit from the channel counter.

A complete discussion of an essentially identical comparator is in the above-mentioned Tanaka application. The only difference is that an RE signal (output of AND 728) is taken from modular comparator 51C for the signal seeking mode. A very brief summary of comparator operation follows. The BA and TD signals to the tri-flop of tens comparator 51A are for prevention of an illogical condition resulting from a varactor failure mode and these signals may be ignored. (They are fully discussed in the Tanaka application.)

Sequential comparison is achieved by inhibiting the AND's and NOR gates of subsequent comparator stages until equality exists in the higher order stages (corresponding to more significant bits). This procedure determines the direction of the difference in the bit strings. The tens comparator 51A includes a tri-flop (three device) which monitors the comparator during the compare interval and retains the last determined state until the next comparison which occurs at the $\phi_1$ timing pulse. The outputs of the tri-flop indicate that the binary signal from the LOF tens counter 66 is greater than, less than, or equal to the corresponding binary signal from tens counter 177 of channel counter 57 and are labelled TRD, TRE and TRU. These signals are sent to ramp voltage source 68 and to the input stage of units comparator 51B.

Units comparator 51B is also a four stage sequential bit comparator similar to the tens comparator with the exception that it does not include tri-flop circuitry. It compares information from LOF units counter 64 and units counter 175 in channel counter 57. The tens comparator overrides units comparison so that if inequality is determined in the tens digit, a simultaneous equality determination (or inequality in the opposite direction) in a units digit will not affect control. As before control is sequentially transferred from stage to stage depending upon comparison of the bit strings and the last stage has three outputs labelled URD, URE and URU to indicate the status of the comparison. These output signals are supplied to the input of modular comparator 51C.

Modular comparator 51C monitors two leads from modular scaler 62 to determine the value of the modular residue. Unlike the previous comparator sections the modular comparator does not have four stages for binary string comparisons. Rather it identifies the residue (indicated by leads PB and PC) from modular scaler 62 as being less than, equal to, or greater than the two preselected residues selected to define the frequency window. This determination is retained with tri-flop circuitry similar to that incorporated in tens comparator 51A.

The frequency window may be skewed relative to the channel picture carrier frequency by selection of appropriate residues. In addition, as described in the Tanaka application, the base of the modular scaler may be increased (preferably by a multiple of six) and a new set of two or more residues chosen to tailor the window as desired.

As is true for the units comparator, the modular comparator is overriden when an inequality exists between the units (or tens digits). Thus, a determination of inequality in the units comparator overrides the modular comparator, and it only controls the ramp voltage source when there is equality between both the tens and units digits of the derived and desired channel number. The state of the modular comparator is monitored by tri-flop circuitry whose outputs RD, RE and RU are at 1 levels for ramp down, ramp equal and ramp up determinations, respectively. The RD and RU signals are supplied directly to ramp voltage source 68. The signal RE is supplied to an input of inverter 786 in channel selection control 53 as previously discussed.

The invention disclosed provides an all-channel electronic signal seeking television tuning system for sweeping through the television frequency spectrum by sequentially tuning a tuner in accordance with FCC allocated channel numbers and terminating the sweep whenever a television signal is recognized. Illegal channel detecting means increase the effective speed and noise immunity by precluding the tuner tuning to frequencies corresponding to unallocated channel members by rendering television signal recognition means uneffective for such signals. The disclosed arrangement combines the speed and precision of a digital electronic system and the signal recognition characteristics of a signal seeking system to provide an improvement over prior systems' conflicting requirements of a capture range broad enough to provide large pull in capability yet narrow enough to provide positive lock on a desired signal.

While a particular embodiment of the invention has been shown and described, it will be obvious to those skilled in the art that changes and modifications may be made without departing from the invention in its broader aspects, and therefore, the aim in the appended claims is to cover all such changes and modifications as fall within the true spirit and scope of the invention.

What is claimed is:

1. A signal seeking television tuning system including a voltage controlled tunable element operable in the FCC allocated television frequency bands containing a plurality of discrete fixed frequency bandwidth television signals identifiable with a corresponding FCC allocated channel number, comprising:
   channel selecting means for sequentially selecting channel information related to said television signals;
   ramp voltage generating means responsive to said channel selecting means for applying voltages for tuning said tunable element to receive corresponding ones of said television signals;
   recognition means for determining the presence of television signals and terminating the operation of said channel selecting means when a television signal is detected; and
   illegal channel information detection means preventing terminating the operation of said channel selection means when the selected channel information does not correspond to any of said plurality of discrete television signals.

2. The signal seeking television tuning system of claim 1, further including clock means coupled to said channel selecting means, said clock means producing a plurality of timing sequence signals for sequentially advancing said channel selecting means at a predetermined rate.

3. The signal seeking television tuning system of claim 2, wherein said channel selecting means includes a counter generating channel information corresponding to the individual digits of said FCC allocated channel numbers.

4. The signal seeking television tuning system of claim 3, wherein said counter includes means for advancing one consecutive channel number at a time for the purpose of sequencing through all combinations of said FCC allocated channel numbers.

5. The signal seeking television tuning system of claim 4, wherein said illegal channel information detection means produce a control signal responsive to channel information corresponding to an FCC allocated channel number for rendering said recognition means effective.

6. The signal seeking television tuning system of claim 5, wherein said channel selecting means further includes mode determination means, coupled between said clock means and said counter, establishing distinct operational modes for said channel selecting means including a first mode during which said illegal channel information detection means is interrogated, a second mode for determining tuning of said tunable element, and a third mode during which said recognition means is rendered effective.

7. The signal seeking television tuning system of claim 6, wherein said first mode is initiated by advancing said counter of said channel selecting means one consecutive channel number.

8. The signal seeking television tuning system of claim 7, further including means, coupled to said tunable element, producing intrachannel spacing information, and means comparing said spacing information with predetermined spacing information and a producing ramp equality signal whenever said tunable element is within a restricted frequency range about the frequency corresponding to the channel number from said channel selecting means; wherein said mode determination means includes coincident logic means responsive to coincidence between said ramp equality signal and said control signal for initiating said third mode.

9. The signal seeking television tuning system of claim 8, wherein said mode determination means further includes means for delaying for a predetermined time the rendering effective of said recognition means.

10. The signal seeking television tuning system of claim 9, wherein said counter comprises a pair of binary coded decimal counters establishing binary encoded representations of said channel numbers, said pair of counters being interconnected to correspond separately to the tens and units digits of said FCC allocated channel numbers.

11. The signal seeking television tuning system of claim 10, wherein said illegal channel information detection means comprises combinational logic means coupled to said pair of counters establishing logic signals when the tens counter is (a) 0, or (b) 8 or 9, and when the units counter is (a) 0 or 1 and (b) 4 to 9, and producing said control signal when the combined logic signals from the tens and units counters correspond to channel numbers 00, 01, and 84 to 99.

* * * * *